(12) United States Patent
Kawahara et al.

(10) Patent No.: US 11,573,487 B2
(45) Date of Patent: Feb. 7, 2023

(54) IMPRINT APPARATUS, IMPRINTING METHOD, AND METHOD OF MANUFACTURING ARTICLE

(71) Applicant: CANON KABUSHIKI KAISHA, Tokyo (JP)

(72) Inventors: Nobuto Kawahara, Utsunomiya (JP); Yutaka Mita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 257 days.

(21) Appl. No.: 16/101,952

(22) Filed: Aug. 13, 2018

(65) Prior Publication Data

US 2019/0057881 A1 Feb. 21, 2019

(30) Foreign Application Priority Data

Aug. 21, 2017 (JP) .............................. JP2017-158784

(51) Int. Cl.
| | | |
|---|---|---|
| G03F 7/00 | (2006.01) |
| H01L 21/67 | (2006.01) |
| H01L 21/68 | (2006.01) |
| B29C 59/02 | (2006.01) |
| B29C 33/42 | (2006.01) |

(52) U.S. Cl.
CPC .......... *G03F 7/0002* (2013.01); *B29C 33/424* (2013.01); *B29C 59/02* (2013.01); *H01L 21/6715* (2013.01); *H01L 21/681* (2013.01)

(58) Field of Classification Search
None
See application file for complete search history.

(56) References Cited

U.S. PATENT DOCUMENTS

| | | | |
|---|---|---|---|
| 2011/0177249 A1* | 7/2011 | Sato | H01L 21/6715 427/277 |
| 2017/0106408 A1* | 4/2017 | Nakata | G03F 7/0002 |

FOREIGN PATENT DOCUMENTS

| | | | |
|---|---|---|---|
| JP | 07192994 A | * | 7/1995 |
| JP | 2003-251792 A | | 9/2003 |
| JP | 2004-025736 A | | 1/2004 |
| JP | 2011-151092 A | | 8/2011 |
| JP | 2014-225648 A | | 12/2014 |
| KR | 2011-0085888 A | | 7/2011 |
| WO | 2014/050891 A1 | | 8/2016 |

* cited by examiner

*Primary Examiner* — Timothy Kennedy
(74) *Attorney, Agent, or Firm* — Canon U.S.A., Inc. I.P. Division

(57) ABSTRACT

An imprint apparatus that molds an imprint material on a substrate with a mold, the imprint apparatus including a applying device that includes a discharge surface in which a discharge opening is formed, the applying device applying the imprint material to the substrate through the discharge opening, and a measuring device that measures the position of the discharge opening by having the measuring device measure a position of an uneven structure formed in a protruded shape or a recessed shape with respect to a direction perpendicular to the discharge surface.

8 Claims, 8 Drawing Sheets

FIG. 3
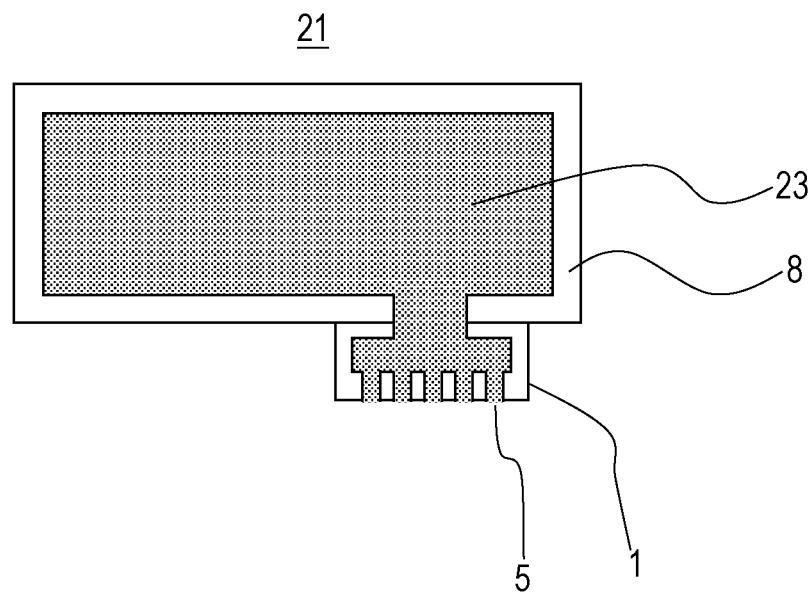
FIG. 4
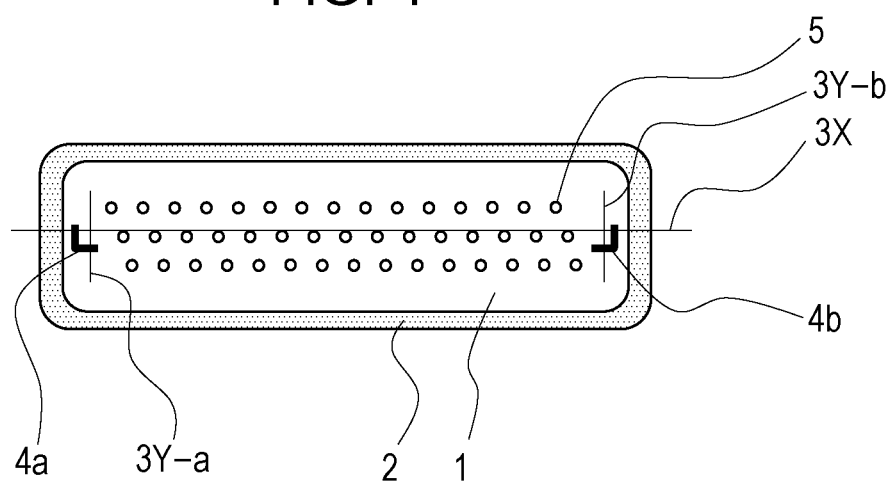
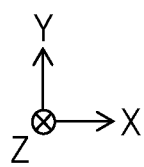

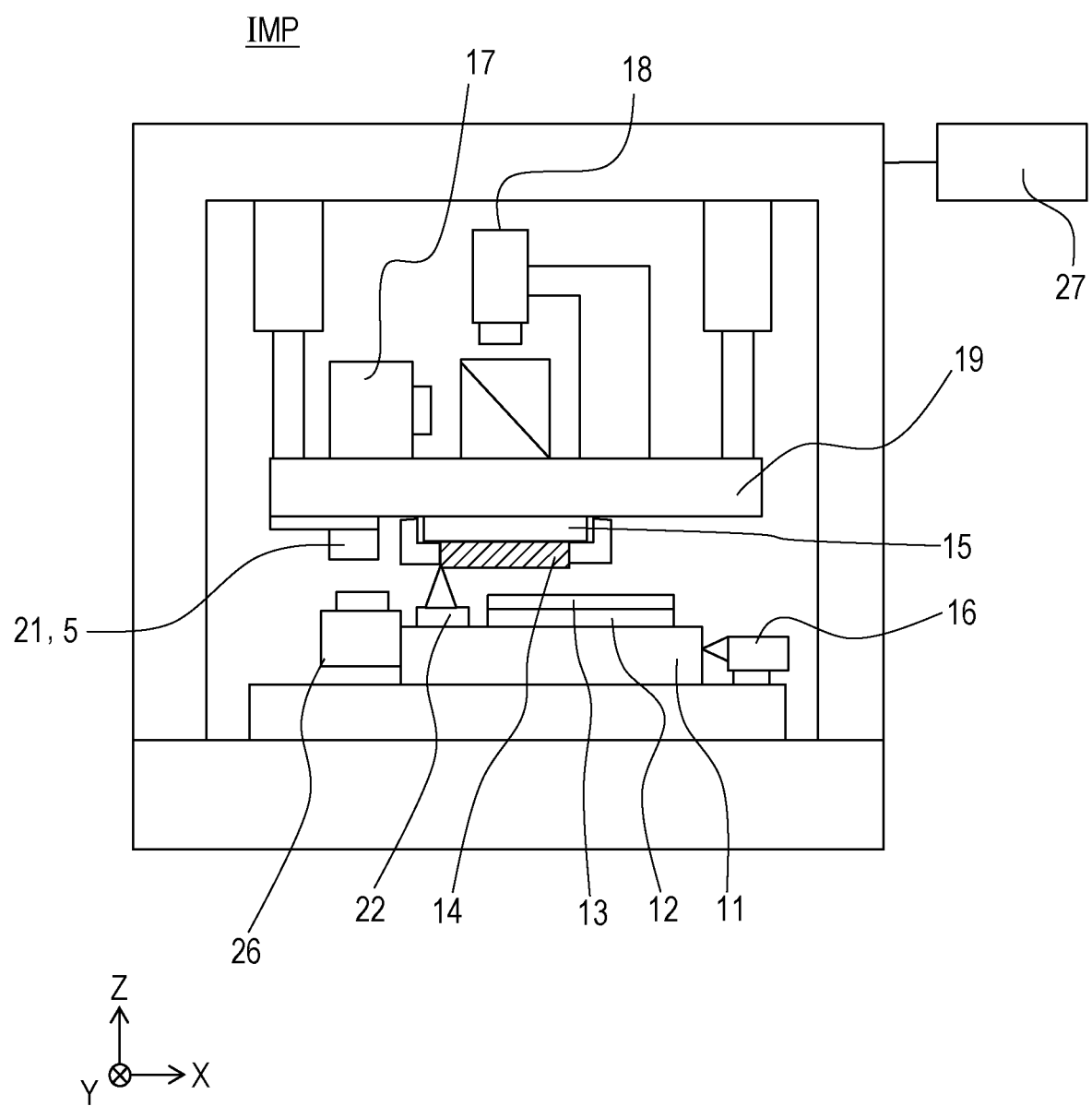

IMPRINT APPARATUS, IMPRINTING METHOD, AND METHOD OF MANUFACTURING ARTICLE

CROSS-REFERENCE TO RELATED APPLICATIONS

This application claims the benefit of priority from Japanese Patent Application No. 2017-158784 filed Aug. 21, 2017, which is hereby incorporated by reference herein in its entirety.

BACKGROUND OF THE INVENTION

Field of the Invention

The present disclosure generally relates to an imprint apparatus that molds an imprint material on a substrate with a mold, an imprinting method, and a method of manufacturing an article.

Description of the Related Art

As a method of manufacturing an article such as a semiconductor device, an imprint technology that forms a pattern of an imprint material on a substrate with a mold is known. In the imprint technology, an imprint material is fed onto a substrate, and a mold is contacted against (imprinted on) the fed imprint material. Furthermore, after the imprint material is cured while being in contact with the mold, the mold is separated (released) from the cured imprint material to form a pattern of the imprint material on the substrate.

In the imprint technology, a method of applying the imprint material onto the substrate includes a method such as applying the imprint material onto the substrate in advance with a coating apparatus (a spin coater, for example) external to the imprint apparatus, or a method using an applying device installed in the imprint apparatus. In a case in which the imprint material is applied using an applying device inside the imprint apparatus, the imprint material needs to be applied onto a predetermined position on the substrate, such as a shot area where a pattern has been formed in advance on the substrate. In order to do so, the imprint apparatus needs to accurately acquire the position of the applying device (to determine the position of the imprint material eventually applied from the applying device) installed inside the imprint apparatus.

An imprint apparatus described in Japanese Patent Laid-Open No. 2011-151092 is provided with an image pickup apparatus, and a position of an applying device is obtained by imaging marks with an image pickup apparatus. In order to accurately acquire the position of the imprint material applied from the applying device, imaging needs to be performed on a discharge surface (discharge openings) of the applying device; accordingly, the image pickup apparatus is provided on a substrate stage that holds a substrate. As described above, the imprint apparatus of Japanese Patent Laid-Open No. 2011-151092 uses, as a member to obtain the position of the applying device, an image pickup apparatus that performs imaging of marks formed on the applying device.

Conventional imprint apparatuses need to provide, on the substrate stage, optical systems, such as an illumination optical system and a detection optical system, included in the image pickup apparatus that performs imaging of the mark, which may increase the size of the substrate stage.

SUMMARY OF THE INVENTION

An imprint apparatus of the present disclosure is an imprint apparatus that forms an imprint material on a substrate with a mold, the imprint apparatus including an applying device that includes a discharge surface in which a discharge opening is formed, the applying device applying the imprint material to the substrate through the discharge opening, and a measuring device that measures the position of the discharge opening by having the measuring device measure a position of an uneven structure formed in a protruded shape or a recessed shape with respect to a direction perpendicular to the discharge surface.

Further features of the present disclosure will become apparent from the following description of exemplary embodiments with reference to the attached drawings.

BRIEF DESCRIPTION OF THE DRAWINGS

FIG. 3 is a diagram illustrating a cross section of an applying device.

FIG. 4 is a diagram illustrating a configuration of a discharge chip of the first exemplary embodiment.

FIG. 9 is a diagram illustrating a conventional imprint apparatus.

DESCRIPTION OF THE EMBODIMENTS

Figure 1:
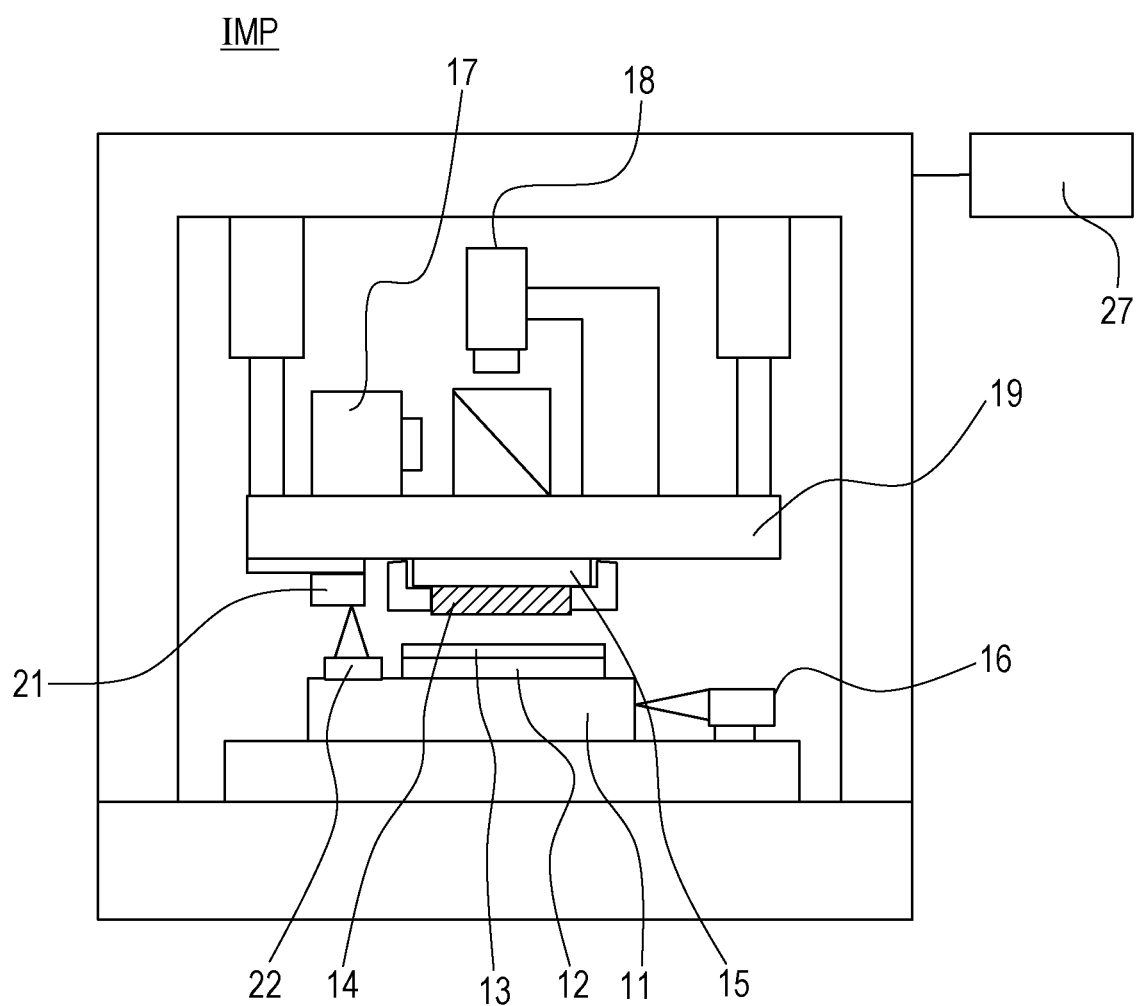
FIG. 1 is a diagram illustrating a configuration of an imprint apparatus of a first exemplary embodiment.

Hereinafter, preferable exemplary embodiments of the present disclosure will be described in detail with reference to the accompanying drawings. Note that in each drawing, the same members will be attached with the same reference numerals and redundant description thereof will be omitted.

First Exemplary Embodiment

FIG. 1 is diagram illustrating a configuration of an imprint apparatus IMP according to a first exemplary embodiment. Referring to FIG. 1, the configuration of the imprint apparatus IMP will be described. As illustrated in FIG. 1, axes will be defined such that an XY plane is a plane on which a substrate 13 is disposed and a direction orthogonal to the XY plane is a Z direction. The imprint apparatus IMP is an apparatus that molds an imprint material on a substrate with a mold. The imprint apparatus IMP is an apparatus in which an imprint material provided on the substrate 13 is made to come into contact with a mold and is applied with curing energy to form a pattern of a hardened material to which a relief pattern of the mold has been transferred. The imprint apparatus IMP in FIG. 1 is used to manufacture a device, such as a semiconductor device, serving as an article. Herein, an imprint apparatus IMP that employs a photo-curing method will be described.

A curing composition (also referred to as a resin in an uncured state) that becomes cured when curing energy is applied thereto is used as the imprint material. An electromagnetic wave, heat, or the like is used as the curing energy. The electromagnetic wave is, for example, light, such as an infrared ray, a visible ray, or an ultraviolet ray, which is selected from a wavelength ranging between 10 nm and 1 mm, inclusive.

The curing composition is a composition that is cured upon irradiation of light or by being heated. Between the above, a photosetting composition, which is cured by light, contains at least a polymerizable compound and a photoinitiator, and may contain a non-polymerizable compound or a solvent as needed. The non-polymerizable compound is at least one selected from a group including a sensitizer, a hydrogen donor, an internal mold release agent, a surfactant, an oxidation inhibitor, and a polymer component.

The imprint material is applied on a substrate in the form of a film with a spin coater or a slit coater. Alternatively, the imprint material may be applied with a liquid ejection head on the substrate in the form of a droplet or in the form of an island or a film formed by connecting a plurality of droplets. The viscosity (the viscosity at 25° C.) of the imprint material 3 is, for example, in the range of 1 mPa·s to 100 mPa·s, inclusive.

Glass, a ceramic, metal, a semiconductor, resin, or the like is used for the substrate 13, and as needed, a member formed of a material different from that of the substrate 13 may be formed on a surface of the substrate 13. Specifically, the substrate 13 is a silicon wafer, a compound semiconductor wafer, a quartz glass, or the like.

The imprint apparatus IMP includes a substrate holding unit 12 that holds the substrate 13, a substrate stage 11 that moves the substrate holding unit 12 on the XY plane, a mold holding unit 15 that holds a mold 14. The imprint apparatus IMP further includes a stage measuring device 16 that measures the position of the substrate stage 11, a light source 17 that emits ultraviolet rays that cure the imprint material, and an image pickup apparatus 18 to observe the substrate 13 and the imprint material through the mold 14.

Furthermore, the imprint apparatus IMP includes an applying device 21 (a dispenser) that applies the imprint material onto the substrate 13, and a measuring device 22 that is provided in the applying device 21 and that measures the position of a discharge surface. The applying device 21 is installed so as to hang down from an upper portion structure 19. The imprint apparatus IMP applies the imprint material to a predetermined area on the substrate 13 by moving the substrate 13, which is on the substrate stage 11 and under the applying device 21, in the XY direction in the figure while discharging the imprint material from the applying device 21 onto the substrate 13. The imprint apparatus IMP includes a control unit 27 that controls the imprint operation. The operations of the units, such as the applying device 21 and the substrate stage 11, are controlled by the control unit 27 of the imprint apparatus IMP. The control unit 27 may be provided inside the imprint apparatus IMP or may be installed at a place other than that of the imprint apparatus IMP and control the imprint apparatus IMP remotely.

FIGS. 2A to 2D are diagrams illustrating a sequence of an imprinting method which forms a pattern of the imprint material with the imprint apparatus IMP according to the first exemplary embodiment. An imprinting method in which a pattern of an imprint material 23 is formed on the substrate 13 using the mold 14 in which a relief pattern 24 is formed will be described next.

Figure 2A:
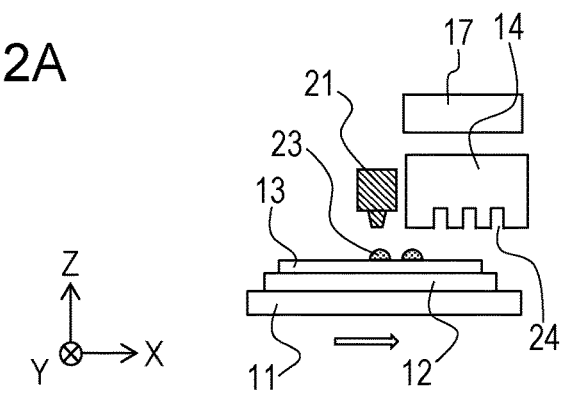
FIGS. 2A to 2D are diagrams illustrating a sequence of an imprinting method.

In FIG. 2A, the substrate 13 is held (held by adsorbing, for example) by the substrate holding unit 12, and by being moved in an arrow direction with the substrate stage 11, the substrate 13 is positioned under the mold 14. The applying device 21 that applies an uncured imprint material 23 in a form of a droplet is disposed in the imprint apparatus IMP, and as illustrated in FIG. 2A, the imprint material 23 is applied while moving the substrate 13. With the above, the imprint apparatus IMP can apply the imprint material 23 to a shot area on the substrate 13.

The mold 14 is formed of a material (quartz, for example) transparent to the light (ultraviolet ray) emitted from the light source 17, and the relief pattern 24 corresponding to the shapes of the electric circuit and the like of the semiconductor device are formed on the surface.

Figure 2B:
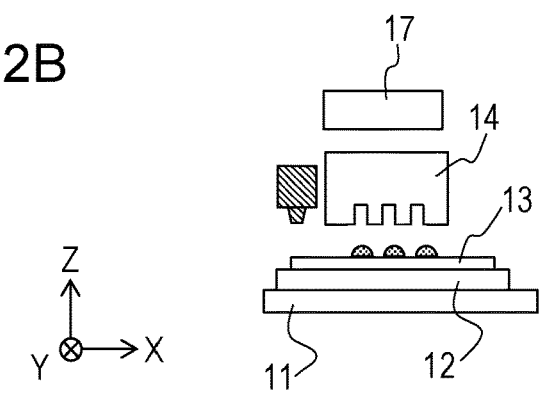

As illustrated in FIG. 2B, the substrate 13 on which the imprint material 23 has been fed with the applying device 21 is aligned with the mold 14. In the above, the aligning of the mold 14 and the substrate 13 with respect to each other may be performed by detecting, with a scope (not shown), alignment marks formed on the substrate 13 and the mold 14.

Figure 2C:
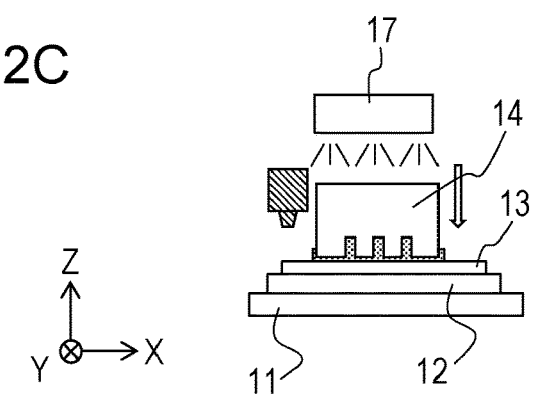

After the relative positions of the mold 14 and the substrate 13 are matched, as illustrated in FIG. 2C, the distance between the mold 14 and the substrate 13 is decreased to contact (imprint) the imprint material 23 fed on the substrate 13 and the mold 14 to each other. By contacting the mold 14 and the imprint material 23 to each other, the imprint material 23 fills the recess in the pattern 24 of the mold 14. Furthermore, when the mold 14 is in contact with the imprint material 23, a gap of a few nanometers to a few tens of nanometers remains between the mold 14 and the substrate 13, and a film (a residual layer) of the imprint material 23 is formed.

Furthermore, in a state in which the mold 14 and the substrate 13 are in contact with each other, when the ultraviolet ray emitted from the light source 17 transmits through the mold 14 and the imprint material 23 is irradiated (exposed) by the ultraviolet ray, the imprint material 23 becomes cured.

Figure 2D:
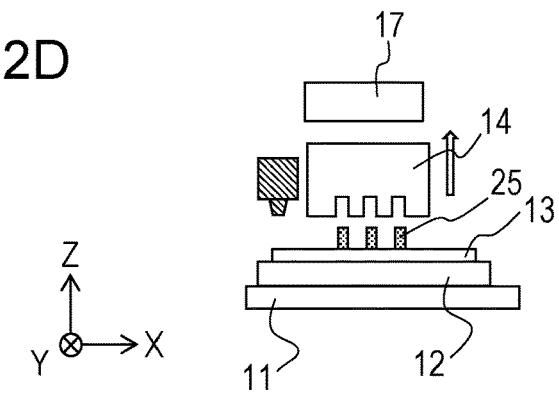

Subsequently, as illustrated in FIG. 2D, by increasing the distance between the substrate 13 and the mold 14, a transfer pattern 25 of the imprint material 23 cured on the substrate 13 is remained.

In the imprinting method described above, the imprint material 23 needs to be filled in the pattern 24 of the mold 14 in a sufficient manner. Furthermore, in order to have no excessive imprint material 23 overflow from the mold 14, in the imprinting method, the position and the amount of the imprint material fed on the substrate 13 need to be controlled in a precise manner in accordance with the shape of the pattern 24 of the mold 14. In order to do so, the position of the applying device 21 in the XY direction with respect to the substrate stage 11 needs to be corrected in a precise manner. In each of the steps in the imprinting method using the imprint apparatus IMP described above, control of the position and the distance of the mold 14 with respect to the substrate 13 is required to be performed in the order of nanometers. Accordingly, the measuring device 22 is disposed in the substrate stage 11 of the imprint apparatus IMP of the first exemplary embodiment illustrated in FIG. 1 so that the distance between the measuring device 22 (the substrate stage 11) and the mold 14 can be measured.

FIG. 9 illustrates an imprint apparatus IMP of the prior art. In the imprint apparatus in FIG. 9, description of members that have the same reference numerals as those of the imprint apparatus IMP in FIG. 1 will be omitted. The applying device 21 is provided with a plurality of discharge openings 5 (nozzles) that discharge the imprint material 23 on the substrate 13. In order to feed the imprint material to a predetermined position on the substrate 13, it is important that the relative positions between the applying device 21 (the discharge openings 5) and the substrate stage 11 are managed and controlled in a precise manner. In the imprint apparatus IMP of the prior art illustrated in FIG. 9, the positions of the discharge openings 5 can be measured with an image pickup apparatus 26 provided on the substrate stage 11 detecting the contours of the discharge openings 5 and the mark formed on the applying device 21. Based on the measurement result of the image pickup apparatus 26, the imprint apparatus IMP can correct the displacement of the discharge openings 5.

However, an illumination optical system and a detection optical system included in the image pickup apparatus 26 need to be provided on the substrate stage 11, and there are concerns of the substrate stage 11 becoming large in size and the accuracy of the substrate stage decreasing due to the image pickup apparatus 26 being a heat source.

A method of detecting the positions of the discharge opening of the applying device 21 according to the imprint apparatus IMP of the first exemplary embodiment will be described. As illustrated in FIG. 1, in the imprint apparatus IMP of the first exemplary embodiment, the imprint material 23 is discharged and fed on the substrate 13 through the discharge openings 5 of the applying device 21 that is hanged from the underside of the upper portion structure 19.

FIG. 3 is a diagram illustrating a cross section of the structure of the applying device 21. In the applying device 21, a tank 8 that stores the imprint material 23 is provided with a discharge chip 1 in which the plurality of discharge openings 5 are formed. The applying device 21 is capable of discharging the imprint material 23 inside the tank 8 through the plurality of discharge openings 5. The discharge chip 1 is capable of controlling the discharge volume and the discharge speed of the imprint material discharged from each of the plurality of discharge openings 5 with a micro electro mechanical system (MEMS) structure.

FIG. 4 is a diagram schematically illustrating the discharge chip 1 included in the applying device 21 provided in the imprint apparatus IMP of the first exemplary embodiment. The discharge chip 1 is attached to a discharge chip base 2. As illustrated in FIG. 4, the plurality of discharge openings 5 are formed in the surface of the discharge chip 1 so as to be arranged in one direction (an X direction). As illustrated in FIG. 4, a plurality of arrays of discharge openings 5 (three arrays in the case of FIG. 4) may be formed. Discharge openings 5 having a MEMS structure are typically manufactured as a three-dimensional structure using a semiconductor manufacturing technique.

Reference marks 4a and 4b formed in a protruded shape or a recessed shape are disposed on the surface (the discharge surface) illustrated in FIG. 4 in which the discharge openings 5 of the discharge chip 1 are formed. The discharge surface is a surface including the discharge openings 5, an uneven structure including a protruded shape or a recessed shape with respect to a direction perpendicular to the discharge surface provided on the applying device 21, and a flat portion other than the above. The measuring device 22 measuring the position of the discharge surface denotes that the positions of each of the discharge openings, the uneven structure, and the flat portion on the discharge surface (especially the positions in the height direction that are perpendicular to the discharge surface, the substrate surface, or the surface of the mold) are measured.

Since the reference marks 4a and 4b formed in or on the discharge chip 1 are formed in the process of manufacturing the discharge openings 5, the relative position between the reference marks 4a and 4b and the discharge openings 5 are controlled with high accuracy. For example, each of the reference marks 4a and 4b illustrated in FIG. 4 is an L-shaped mark that is a combination of two straight lines parallel to an X-axis direction and the Y-axis direction. The above is because the discharge openings 5 in FIG. 4 are arranged parallel to the X-axis direction. As above, the straight lines constituting the reference marks 4a and 4b are, desirably, formed parallel and perpendicular to the direction in which the discharge openings 5 are arranged. While in the discharge chip 1 illustrated in FIG. 4, a plurality of reference marks 4a and 4b are formed so as to interpose the discharge openings 5 in between, the number of reference marks that are formed may be one, or may be three or more.

In the imprinting process using the imprint apparatus IMP of the first exemplary embodiment, the position of the applying device 21 (the position of the discharge openings 5) is obtained by using the reference marks 4a and 4b formed on the discharge chip 1. Before applying the imprint material 23 from the applying device 21, the imprint apparatus IMP moves the measuring device 22 illustrated in FIG. 1 in the XY direction at a portion below the applying device 21. By so doing, the measuring device 22 can measure the reference marks 4a and 4b formed in or on the discharge surface of the discharge chip 1. The measuring device 22 collects information (positions and shapes) of the uneven structures of the reference marks 4a and 4b by measuring the distance to the discharge surface while scanning the discharge surface.

Figure 5:
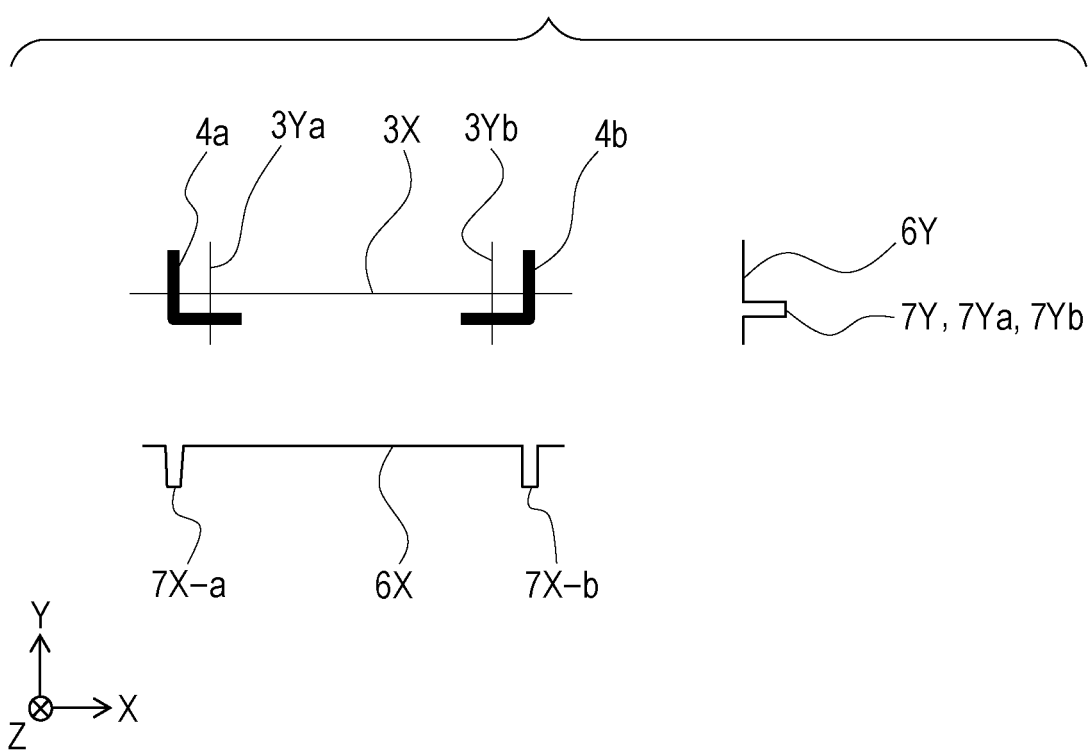
FIG. 5 is a diagram illustrating a configuration of reference marks of the first exemplary embodiment.

Referring to FIGS. 4 and 5, a method of collecting the information on the uneven structures of the reference marks 4a and 4b will be described specifically. As illustrated in FIG. 4, a measurement point of the measuring device 22 is moved along detection trajectories 3X, 3Ya, and 3Yb. Since the reference marks 4a and 4b are formed in a protruded shape or a recessed shape, when the measuring device 22 is scanned along the detection trajectory 3X as illustrated in FIG. 5, the height signal in the detection result changes at the positions of the reference marks 4a and 4b, as depicted by detection signal 6X. The measuring device 22 can detect the positions of the reference marks 4a and 4b in the above manner.

Similarly, when scanning is performed along the detection trajectories 3Ya and 3Yb, the height signal in the detection result changes at the positions of the reference marks 4a and 4b as depicted by the detection signal 6Y. The positions of the reference marks 4a and 4b can be detected with the detection signal obtained in the above manner.

The reference marks 4a and 4b are formed in a three-dimensional manner with respect to the surface (the discharge surface) of the discharge chip 1. Furthermore, the measuring device 22 uses a distance measuring sensor that is capable of measuring the distance to the portion that is to be measured. Accordingly, detection signal peaks 7Xa and 7Xb that correspond to the positions of the reference marks 4a and 4b are obtained in the detection signal 6X, which is an output signal of the measuring device 22. By synchronizing the positions of the detection signal peaks 7Xa and 7Xb with the position information of the substrate stage 11 on which the measuring device 22 is mounted, the position of the discharge chip 1 (the applying device 21) in the X-axis direction with respect to the substrate stage 11 can be obtained. Furthermore, a deviation amount of the discharge chip 1 in the X-axis direction with respect to the reference position set in the imprint apparatus IMP can be obtained. The deviation amount of the discharge chip 1 with respect to the reference position is equivalent to the deviation amount of the discharge openings 5 with respect to the substrate stage 11.

Accordingly, the deviation amount obtained above is stored in the control unit 27 in FIG. 1 and, further, is fed back into the information on the discharge position of the imprint material discharged from the discharge openings 5. Furthermore, the resist can be applied to the correct position by reflecting the correction to the information on the applying position of the imprint material calculated from the information on the discharge position.

Similarly, when the substrate stage 11 is scanned in the Y-axis direction, the detection signal peak 7Y is detected in the detection signal 6Y at the positions of the detection trajectories 3Ya and 3Yb corresponding to the positions of the reference marks 4a and 4b. Accordingly, the position of the discharge chip 1 in the Y-axis direction with respect to the substrate stage 11 can be obtained. Furthermore, a deviation amount of the discharge chip 1 in the Y-axis direction with respect to the reference position set in the imprint apparatus IMP can be obtained.

In FIG. 5, the reference marks 4a and 4b are provided so that when the reference marks 4a and 4b are scanned in the Y-axis direction, the substrate stage 11 traverses over the detection trajectories 3Ya and 3Yb at the same position. Furthermore, in a case in which the discharge chip 1 is disposed rotated about a Z-axis in FIG. 5, there will be a deviation in the positions of the detection signal peaks 7Y (7Ya and 7Yb) detected in the detection signals 6Ya and 6Yb; accordingly, it goes without saying that the correction of the deviation can be carried out.

While the information on the position of the applying device 21 can be obtained by detecting the contours of the discharge openings 5 with the measuring device 22, since the imprint material before discharge is filled in the discharge openings 5, there is a concern that the solidified imprint material and particles may be attached to the circumferences of the discharge openings 5. Accordingly, when directly detecting the contours of the discharge openings 5 with the measuring device 22, there may be a concern that the detection cannot be performed in an accurate manner. Due to the above, the reference marks 4a and 4b according to the first exemplary embodiment are, as illustrated in FIG. 4, disposed at positions away from the discharge openings 5; accordingly, stability in detecting the position of the applying device 21 can be improved.

The imprint apparatus IMP of the exemplary embodiment described above is capable of detecting the position of the applying device 21 with the measuring device 22 that has been provided in the substrate state 11. Accordingly, since there is no need to dispose an image pickup apparatus, which acquires the image of the mark on the applying device 21, in the imprint apparatus IMP, increase in the size and weight of the substrate stage 11 can be prevented. Furthermore, the influence of the heat of the image pickup apparatus on the substrate stage 11 can be reduced.

Second Exemplary Embodiment

When the discharge chip 1 applies the imprint material on the substrate 13 in the step illustrated in FIG. 2A, the discharge chip 1 performs the discharge operation while synchronizing with the movement of the substrate 13 moved by the substrate stage 11 in the arrow direction illustrated in FIG. 2A. Accordingly, if the distance and the degree of parallelization between the flat surface of the discharge chip 1 in which the discharge openings 5 are arranged and the substrate 13 do not have the target accuracy, the time for the imprint material 23 to reach the substrate 13 becomes inappropriate and, as a result, the position at which the imprint material 23 is fed is deviated from the assumed position. While in the description referring to FIG. 5, a method of correcting the displacement related to the XY plane in the drawing has been described; however, in actuality, control and correction of the relative distance and the degree of parallelization between the surface of the discharge chip 1 and the substrate 13 in the Z direction in the drawing also need to be performed in an accurate manner.

In addition to detecting signal peaks 7Xa, 7Xb, and 7Y (7Ya and 7Yb), the detection signals 6X and 6Y illustrated in FIG. 5 simultaneously measure the height information of the surface of the discharge chip 1 at positions other than where the peaks are positioned. With the above, in the imprint apparatus according to the second exemplary embodiment, displacement in the three axes X, Y, and Z directions can be obtained with the measurement result obtained by scanning the discharge surface with the measuring device 22. Since in the imprint apparatus of the second exemplary embodiment, the correction in the three axes X, Y, and Z directions can be completed with a single measuring operation, the device configuration can be simplified and, additionally, the correction steps can be reduced.

Third Exemplary Embodiment

In the exemplary embodiments described above, an example has been given in which the positions of the reference marks 4a and 4b are read by scanning the discharge surface of the discharge chip 1 with the measuring device 22 in two directions. In a third exemplary embodiment, a case in which the position of the applying device 21 is obtained by scanning the discharge surface in one direction will be described.

Figure 6:
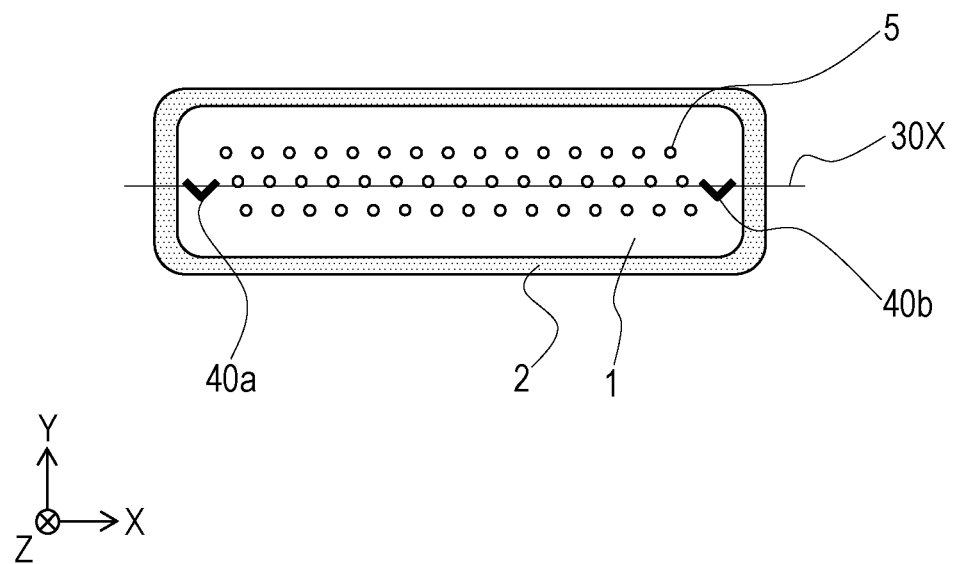
FIG. 6 is a diagram illustrating a configuration of a discharge chip of a third exemplary embodiment.

FIG. 6 is a diagram schematically illustrating the discharge chip 1 included in the applying device 21 provided in the imprint apparatus IMP of the third exemplary embodiment. As illustrated in FIG. 6, the plurality of discharge openings 5 are formed in the surface of the discharge chip 1 so as to be arranged in one direction (the X direction). Reference marks 40a and 40b formed in a protruded shape or a recessed shape are disposed on the surface (the discharge surface) illustrated in FIG. 6 in which the discharge openings 5 of the discharge chip 1 are formed. Since the reference marks 40a and 40b formed in or on the discharge chip 1 are formed in the process of manufacturing the discharge openings 5, the relative position between the reference marks 40a and 40b and the discharge openings 5 are controlled with high accuracy. The reference marks 40a and 40b illustrated in FIG. 6 each have a so-called V-shape that is a shape in which the reference marks illustrated in FIG. 4 have been rotated 45 degrees about the Z-axis.

Figure 7A:
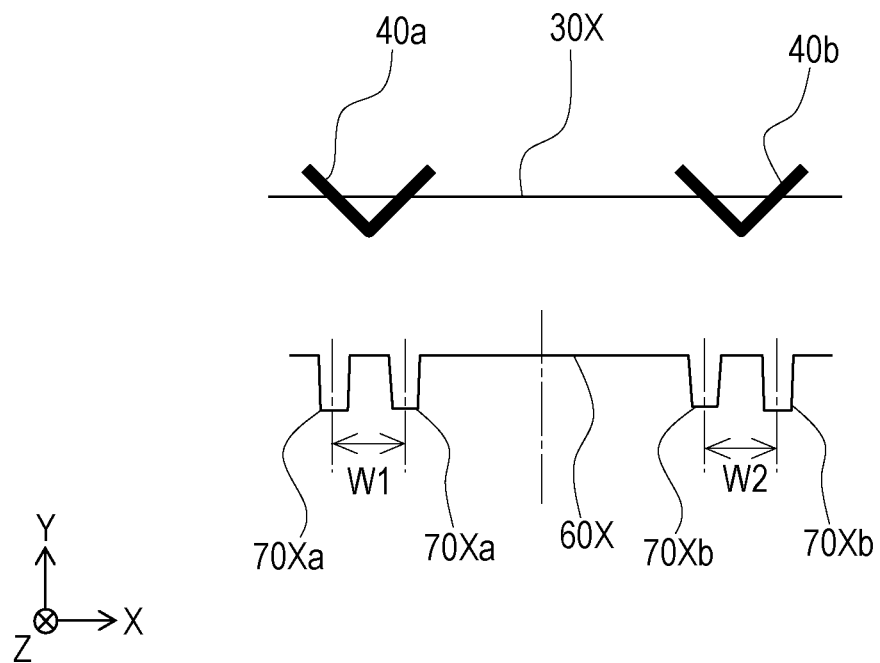
FIGS. 7A and 7B are diagrams illustrating configurations of reference marks of the third exemplary embodiment.
Figure 7B:
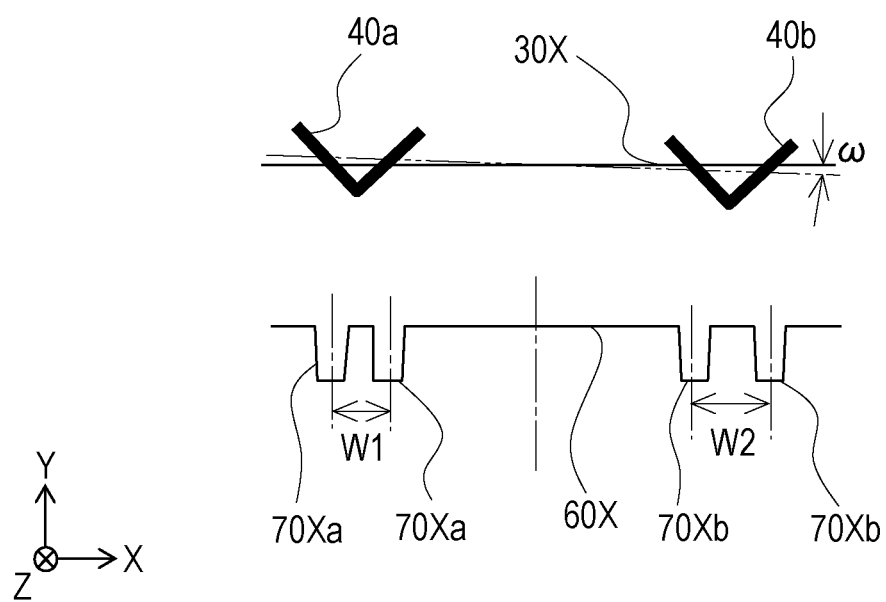

Referring to FIGS. 6 and 7, a method of collecting the information of the uneven structures of the reference marks 40a and 40b will be described specifically. As illustrated in FIG. 6, the measurement point of the measuring device 22 is moved along a detection trajectory 30X. Since the reference marks 40a and 40b are formed in a protruded shape or a recessed shape, when the measuring device 22 is scanned along the detection trajectory 30X as illustrated in FIGS. 7A and 7B, the height signal in the detection result changes at the positions of the reference marks 40a and 40b, as depicted by detection signal 60X.

As illustrated in FIG. 7A, when the positions of the reference marks 40a and 40b deviate in the Y direction with respect to the detection trajetory 30X, values of distances W1 and W2 of detection signal peaks (70Xa and 70Xb) generated in the detection signal 60X change in accordance with the deviation amount. The measuring device 22 can detect the positions of the reference marks 40a and 40b in the above manner.

Furthermore, as illustrated in FIG. 7B, in a case in which the dispositions of the reference marks 40a and 40b are rotationally deviated by an angle ω with respect to the X-axis, the amount of deviation in the rotation direction can be detected by detecting the detection signal peaks (70Xa and 70Xb). In the detection signal of the reference marks 40a and 40b illustrated in FIG. 7B, differences in the values of the distances W1 and W2 in the detection signal peaks (70Xa and 70Xb) occur in accordance with the angle ω. Accordingly, the imprint apparatus of the third exemplary embodiment can detect the deviation amount of the applying device 21 in the rotation direction.

As described above, the measuring method of the third exemplary embodiment can measure the deviation amount in two directions, namely, in the X-axis and the Y-axis directions without, as in the first exemplary embodiment, scanning the measuring device 22 in the Y direction. Moreover, according to the measuring method of the present exemplary embodiment the deviation amount in the rotation direction with respect to the rotation direction of the Z-axis can be measured.

As described above, by forming the reference mark shapes illustrated in FIG. 6 in the applying device 21, the number of measurement for the correction of the position of the applying device 21 can be reduced as well. Furthermore, the shapes of the reference marks 40a and 40b are not limited to those illustrated in FIGS. 6 and 7, and may be any other shape such as a semicircular shape that has the same object.

Fourth Exemplary Embodiment

Figure 8:
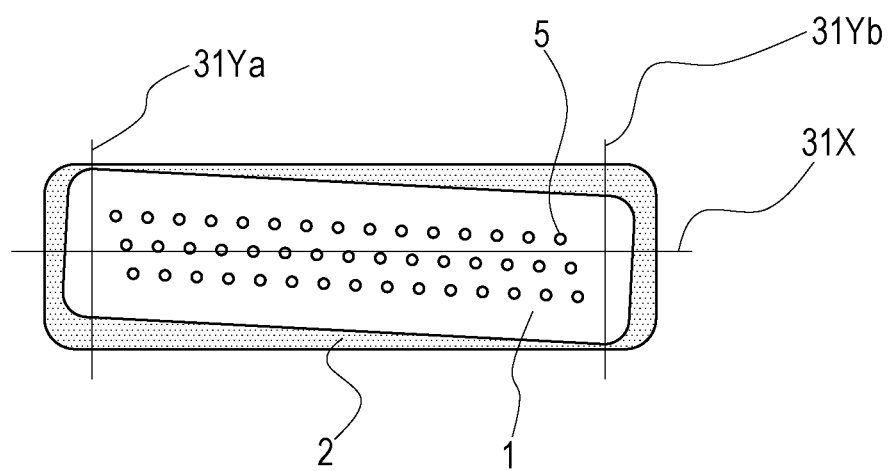
FIG. 8 is a diagram illustrating a configuration of a discharge chip of a fourth exemplary embodiment.

Referring next to FIG. 8, a method of measuring the position of the applying device 21 (the discharge chip 1), according to a fourth exemplary embodiment will be described. FIG. 8 is a diagram illustrating the discharge chip 1 provided in the applying device 21 of the fourth exemplary embodiment. As illustrated in FIG. 8, the discharge chip 1 of the fourth exemplary embodiment does not have any uneven structured reference marks in or on the surface of the discharge chip 1. In the fourth exemplary embodiment, a contour line of the outer shape of the discharge chip 1 is used as the reference mark. In the imprint apparatus of the fourth exemplary embodiment, the measuring device 22 detects the level difference between the discharge chip 1 and the discharge chip base 2 as an uneven structure to obtain the position of the contour line of the outer shape. As described above, the discharge chip 1 is manufactured in a three-dimensional manner using a semiconductor manufacturing process. Accordingly, the contour shape of the outer shape created by the level difference between the discharge chip 1 and the discharge chip base 2 can be formed in a highly accurate manner with respect to the discharge openings 5.

Accordingly, in the imprint apparatus of the fourth exemplary embodiment, the position of the discharge chip 1 (the discharge openings 5) can be obtained without forming the reference marks in or on the discharge chip 1. By setting the detection trajectories 31X, 31Ya, and 31Yb as illustrated in FIG. 8, and by detecting the level difference of the counter line of the outer shape of the discharge chip 1, similar to the detection of the reference marks, the position of the discharge chip 1 and the rotational deviation can be measured.

As described above, since the discharge chip 1 adopts a MEMS structure, the discharge chip 1 needs to be replaced on a regular basis at a specific cycle of a few months to a few years. Furthermore, different types of imprint materials 23 are used in the imprinting process according to the purpose thereof.

As illustrated in FIG. 3, in the applying device 21, the discharge chip 1 is provided on the tank 8 that stores the imprint material 23. Accordingly, there are some imprint materials 23 that have entered inside the discharge chip 1 as well, and when the type of imprint material 23 is changed, the discharge chip 1 also needs to be replaced at the same time. When replacing the discharge chip 1, the relative position between the discharge chip 1 (the discharge openings 5) and the substrate stage 11 needs to be corrected every time; accordingly, the positions of the discharge openings 5 are measured in each of the different applying devices 21. In a case of replacing the applying devices 21, the positions of the discharge openings 5 are measured in each of the applying devices 21. Furthermore, the control unit 27 of the imprint apparatus IMP uses the measurement result as the correction value when applying the imprint material on the substrate 13, and controls the discharge operation of the applying device 21.

In all of the exemplary embodiments described above, the imprint apparatus IMP is capable of reading information related to the relative position between the applying device 21 (the discharge openings 5) and the substrate stage 11 without discharging the imprint material 23 from the discharge openings 5. Accordingly, the position of the applying device 21 can be measured without wastefully consuming the imprint material for the correction work, or without using a dummy substrate for measuring the discharge position. As described above, the displacement of the applying device 21 can be measured with a simple configuration, and the applying position of the imprint material 23 can be corrected on the basis of the measurement result.

In all of the exemplary embodiments described above, an imprinting method using a photo-curing method that cures the imprint material by irradiating light has been described; however, the imprinting method is not limited to the photo-curing method and may be a thermal cycle method. In the thermal cycle method, a pattern is formed by heating a thermoplastic resin to a glass transition temperature or a temperature higher than that, pressing a mold against a substrate with the resin in a highly fluid state in between, and separating the cooled resin from the mold.

Method of Manufacturing Article

The pattern of the hardened material formed using the imprint apparatus is permanently used in at least a portion of an article of various kinds, or is used temporarily when manufacturing an article of various kinds. An article includes an electric circuit device, an optical device, a MEMS, a storage device, a sensor, or a mold. The electric circuit device includes a volatile or nonvolatile semiconductor memory, such as a DRAM, an SRAM, a flash memory, or an MRAM, or a semiconductor device, such as an LSI, a CCD, an image sensor, or an FPGA. The mold includes an imprint mold.

The pattern of the hardened material is used as a constituting member of at least a portion of the article described above, is used as it is, or is temporarily used as a resist mask.

During the step in which the substrate is processed, after etching, ion implantation, or the like has been performed, the resist mask is removed.

Figure 10A:
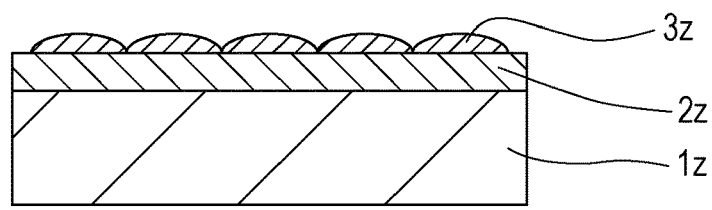
FIGS. 10A to 10F are diagrams for describing a method of manufacturing an article.

A specific method of manufacturing an article will be described next. As illustrated in FIG. 10A, a substrate 1z such as a silicon wafer or the like in which a processed material 2z such as an insulating material or the like is formed on a surface is prepared. Subsequently, an imprint material 3z is applied on the surface of the processed material 2z with an ink jet method or the like. In the diagram, a state in which the imprint material 3z, in a form of a plurality of droplets, is applied on the substrate is illustrated.

Figure 10B:
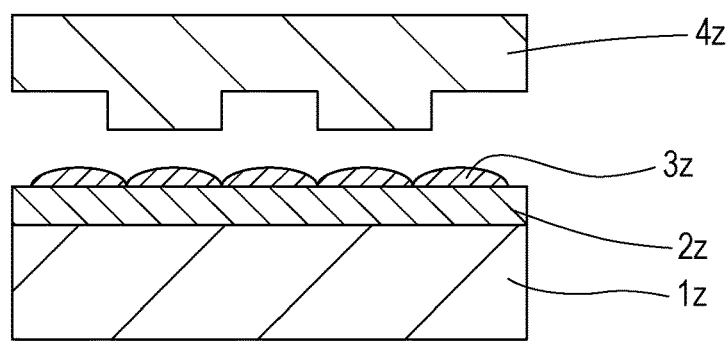
Figure 10C:
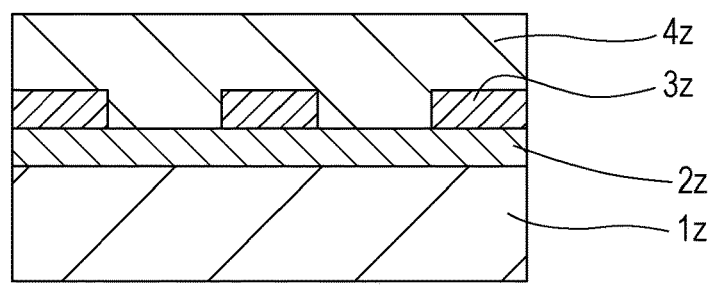

As illustrated in FIG. 10B, a side of an imprint mold 4z on which a relief pattern is formed is oriented towards and made to oppose the imprint material 3z on the substrate. As illustrated in FIG. 10C, the substrate 1z on which the imprint material 3z has been applied and the mold 4z are contacted to each other, and pressure is applied thereto. The imprint material 3z fills the gaps between the mold 4z and the processed material 2z. In the above state, a light serving as curing energy passing through the mold 4z is irradiated, and the imprint material 3z becomes cured.

Figure 10D:
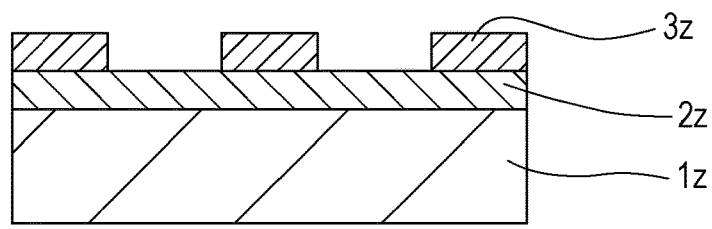

As illustrated in FIG. 10D, after curing the imprint material 3z, the mold 4z and the substrate 1z are separated from each other, and a pattern of the hardened material of the imprint material 3z is formed on the substrate 1z. In the pattern of the hardened material, the recessed portion of the mold has the shape corresponding to the protruded portion of the hardened material, and the protruded portion of the mold has the shape corresponding to the recessed portion of the hardened material, in other words, the relief pattern of the mold 4z is transferred to the imprint material 3z.

Figure 10E:
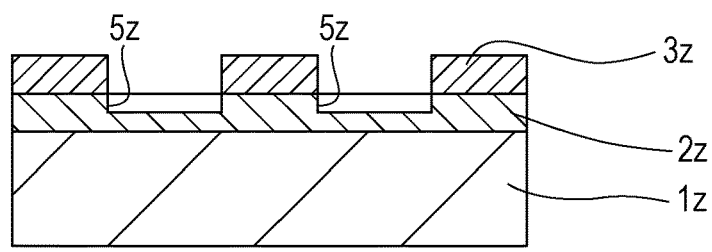
Figure 10F:
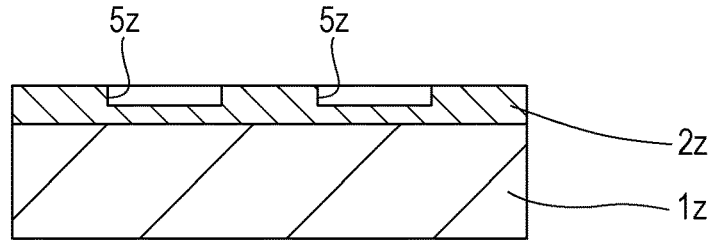

As illustrated in FIG. 10E, when etching is performed while having the pattern of the hardened material serve as an etching-resistant mask, in the surface of the processed material 2z, portions with no hardened material or portions with thin residue of the hardened material are removed, and the surface becomes grooves 5z. As illustrated in FIG. 10F, when the pattern of the hardened material is removed, an article having grooves 5z formed in the surface of the processed material 2z can be obtained. Herein, while the pattern of the hardened material has been removed, the pattern may not be removed after the processing and, for example, may be used as an interlayer insulation film included in a semiconductor device and the like, in other words, may be used as a constituting member of the article.

While preferable embodiments of the present disclosure have been described above, the present disclosure is not limited to the embodiments and may be modified within the gist of the present disclosure.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An imprint apparatus that forms an imprint material on a substrate with a mold, the imprint apparatus comprising:
   an applying device that includes a discharge surface in which a discharge opening is formed, the applying device applying the imprint material to the substrate through the discharge opening;
   a mark of a predetermined shape disposed on the discharge surface, with features that protrude from or recede into the discharge surface in a direction perpendicular to the discharge surface;
   a substrate stage configured to move a substrate under the applying device or the mold;
   a distance sensor, mounted on the substrate stage, which outputs a signal corresponding to a measurement of distance from the substrate stage to a measurement point on the discharge surface as the measurement point is moved along a detection trajectory, wherein changes in amplitude of the signal correspond to detection of the features of the mark, and
   wherein a control unit determines a position of the applying device by correlating lengths measured between the detected features of the mark with a position of the substrate stage, and controls a position of the imprint material fed onto the substrate through the discharge opening on a basis of the determination.

2. The imprint apparatus according to claim 1, wherein deviations of the measured lengths from actual lengths between features of the mark are used to determine the position of the discharge opening.

3. The imprint apparatus according to claim 1, wherein the mark is disposed at a predetermined position on the discharge surface with respect to the discharge opening.

4. The imprint apparatus according to claim 1, wherein a plurality of marks are disposed on the discharge surface.

5. The imprint apparatus according to claim 1, wherein the mark is detected when the substrate stage is moved in a predetermined pattern under the applying device.

6. The imprint apparatus according to claim 5, wherein the predetermined pattern is a single line extending parallel to a longitudinal centerline of the discharge surface.

7. The imprint apparatus according to claim 1, wherein the substrate stage is moved within a horizontal plane that is perpendicular to a discharge direction of the imprint material.

8. The imprint apparatus according to claim 1, wherein a deviation of the measured lengths from actual lengths between features of the mark are used to determine an orientation deviation of the discharge surface.

* * * * *